(12) United States Patent
Wilson et al.

(10) Patent No.: US 7,754,579 B2
(45) Date of Patent: Jul. 13, 2010

(54) METHOD OF FORMING A SEMICONDUCTOR DEVICE

(75) Inventors: Kimberly Wilson, Dresden (DE); Hans-Peter Moll, Dresden (DE); Rolf Weis, Dresden (DE); Phillip Stopford, Dresden (DE); Frank Ludwig, Dresden (DE)

(73) Assignee: Qimonda AG, Munich (DE)

( * ) Notice: Subject to any disclaimer, the term of this patent is extended or adjusted under 35 U.S.C. 154(b) by 996 days.

(21) Appl. No.: 11/507,647

(22) Filed: Aug. 21, 2006

(65) Prior Publication Data

US 2008/0044980 A1 Feb. 21, 2008

(51) Int. Cl.
*H01L 21/76* (2006.01)

(52) U.S. Cl. .................. 438/424; 438/942; 438/952; 257/510; 257/E21.023

(58) Field of Classification Search ................ 438/424, 438/942, 952; 257/510, E21.023
See application file for complete search history.

(56) References Cited

U.S. PATENT DOCUMENTS

| | | | |
|---|---|---|---|
| 6,709,924 B1* | 3/2004 | Yu et al. | 438/257 |
| 6,734,080 B1* | 5/2004 | Yang et al. | 438/427 |
| 6,750,097 B2 | 6/2004 | Divakaruni et al. | |
| 6,774,008 B1* | 8/2004 | Su et al. | 438/424 |
| 7,344,954 B2* | 3/2008 | Yeh et al. | 438/386 |
| 7,494,890 B2* | 2/2009 | Su | 438/386 |
| 2002/0068413 A1* | 6/2002 | Konishi | 438/424 |
| 2004/0209486 A1 | 10/2004 | Naeem et al. | |
| 2005/0085042 A1* | 4/2005 | Chun et al. | 438/275 |

* cited by examiner

*Primary Examiner*—Zandra Smith
*Assistant Examiner*—Christy L Novacek
(74) *Attorney, Agent, or Firm*—Slater & Matsil, L.L.P.

(57) ABSTRACT

A method of forming a semiconductor device includes depositing a fill material (4) on a substrate portion (2) and on a dielectric layer (3) being disposed on the substrate (1) and having an opening (10) located above the substrate portion (2), removing the fill material (4) disposed above the dielectric layer (3), thereby leaving an exposed top surface (6) of the dielectric layer (3) and residual fill material (15) within the opening (10), forming a hard mask material (5) on the exposed top surface (6) of the dielectric layer (3) and on the residual fill material (15), patterning the hard mask material (5) for forming a hard mask (25) having trenches (8a, 8b) extending along a lateral direction (X) and exposing portions of the residual fill material (15) adjacent to the dielectric layer (3) and portions of the dielectric layer (3) adjacent to the residual fill material (15), anisotropically etching the dielectric layer (3), the residual fill material (15) and the substrate (1) selectively to the hard mask (5), thereby forming at least a first and a second isolation trench (11a, 11b) extending along the lateral direction (X).

31 Claims, 5 Drawing Sheets ness of the trenches in the underlying material may be wider or smaller than the lateral dimensions of the trenches 27a, 27b of the patterned anti-reflective coating layer 30. This phenomenon is well-known as Reactive Ion Etching (RIE) lag.

METHOD OF FORMING A SEMICONDUCTOR DEVICE

TECHNICAL FIELD

The present invention relates to a method of forming a semiconductor device and more specifically to a method of forming a semiconductor device including an isolation trench structure.

BACKGROUND

Semiconductor devices are typically formed on and within semiconductor substrates, such as bulk monocrystalline silicon wafers. Electrical components formed on substrates, and particularly bulk semiconductor wafers, are located in dedicated active areas of the substrate wherein adjacent active areas are isolated from each other by insulating materials. One well-known isolation technique uses trench isolations, wherein trenches are formed into a substrate and subsequently filled with an insulating material. The insulating material is then planarized to define isolation trenches filled with insulating material that isolate adjacent active areas from each other. The etching of isolation trenches into a substrate to define active areas is also referred to as structuring of line-space patterns on the wafer.

The formation of trench isolations on structured wafers that have a non-planar top surface typically comprises several process steps. With reference to FIG. 1, a typical process for the formation of trench isolations on topology wafers is illustrated. FIG. 1 depicts a substrate 1 having a layer 3 disposed thereon. The layer 3 has an opening 10 such that a portion 2 of the substrate 1 is exposed, wherein a top surface of the substrate portion 2 is recessed below a main surface of the substrate 1. In a first step, a fill material 4, typically boro-silicate glass or spin-on glass is deposited on the layer 3 and in the opening 10. Then, a hard mask material 5 is deposited on the fill material 4 and a patterned anti-reflective coating layer 30 having a first and a second trench 27a, 27b extending along a lateral direction X is formed on the hard mask material 5, wherein the first and second trenches 27a, 27b each are located above outer portions of the fill material 4 inside the opening 10 and above portions of the layer 3 adjacent to the fill material 4 in the opening 10. The first and the second trench 27a, 27b of the patterned anti-reflective coating layer 30 each have a lateral dimension $S_0$ along the direction Y as depicted in FIG. 1, wherein $S_0$ is referred to as space width. A remaining portion 30a of the patterned anti-reflective coating layer 30 located between the first and second trenches 27a, 27b has a lateral dimension $L_0$ along the direction Y as depicted in FIG. 1, wherein $L_0$ is referred to as line width.

Thereafter, a first etching step I is performed in which the hard mask material 5 is etched selectively to the patterned anti-reflective coating layer 30 to form a patterned hard mask, and thereby exposing portions of the fill material 4. Subsequently, a second etching step II is performed in which the layer 3 and the fill material 4 are etched selectively with respect to the patterned hard mask. In a third etching step III, the substrate 1 is etched through openings of the hard mask and through openings of the fill material to form a first and a second isolation trench 11a, 11b. The resulting first and second isolation trenches 11a, 11b are depicted in FIG. 1 by dashed lines.

Each of the first I, second II and third III etching steps are typically performed in a dry etching tool by a reactive ion etching (RIE) or dry etching process. The RIE process comprises flowing a gas including suitable etchants to the substrate and operating a lower RF source and an upper RF source of the dry etching tool at specific power levels.

However, the lateral dimensions $S_0$ of the trenches 27a, 27b of the patterned anti-reflective coating layer 30 may not be transferred directly to the underlying material when reactive ion etching is performed. The resulting lateral dimensions of the trenches in the underlying material may be wider or smaller than the lateral dimensions of the trenches 27a, 27b of the patterned anti-reflective coating layer 30. This phenomenon is well-known as Reactive Ion Etching (RIE) lag.

In the case that the substrate portion 2 comprises an oxide material, the selectivity between the fill material that comprises an oxide and the substrate is very low during the third etching step III. Therefore, the lateral dimensions of the resulting isolation trench in the substrate are much wider than the lateral dimensions of the opening of the hard mask.

With reference to FIGS. 2A and 2B, the lateral dimensions space width (S) and line width (L) are depicted dependent on the position in the direction Z as shown in FIG. 1. The Z-position "1" relates to the interface between the hard mask material 5 and the fill material 4, the Z-position "2" relates to the interface between the layer 3 and the substrate 1 and the Z-position "3" relates to a bottom of the isolation trenches 11a, 11b disposed in the substrate 1.

As depicted in FIG. 2B, the space width strongly increases during the third etching step III from $S_2$ to $S_3$. Accordingly, the first and second etching steps I, II have to be adapted to provide a very small space width $S_2$ after the second etching step II has been performed to form isolation trenches having the desired lateral dimension. However, for even higher integration, the space width $S_2$ approaches zero. Accordingly, the current integration scheme is limited.

It is desirable to provide an improved method of forming a semiconductor device.

SUMMARY OF THE INVENTION

One embodiment of the present invention provides a method of forming a semiconductor device. The method comprises depositing a fill material on at least a portion of a substrate and on a dielectric layer disposed on the substrate, the dielectric layer having an opening located above the substrate portion, wherein the fill material fills the opening. The method further comprises removing the fill material disposed above the dielectric layer, thereby leaving an exposed top surface of the dielectric layer and residual fill material within the opening, forming a hard mask material on the exposed top surface of the dielectric layer and on the residual fill material, patterning the hard mask material for forming a hard mask having at least a first and a second trench, the first and second trenches exposing portions of the residual fill material adjacent to the dielectric layer and portions of the dielectric layer adjacent to the residual fill material. The method further comprises anisotropically etching the dielectric layer, the residual fill material and the substrate selectively to the hard mask, thereby forming at least a first and a second isolation trench.

Another embodiment of the present invention provides a method of forming a semiconductor device. The method comprises depositing a fill material on at least a portion of a substrate and on an etch stop layer disposed on the substrate, the etch stop layer having an opening located above the substrate portion, wherein the fill material fills the opening. The method further comprises removing the fill material disposed above the etch stop layer, thereby leaving an exposed top surface of the etch stop layer and residual fill material within the opening. The method further comprises forming a hard mask on the exposed top surface of the etch stop layer and on the residual fill material, the hard mask having at least a first and a second trench, the first and second trenches exposing portions of the residual fill material adjacent to the etch stop layer and portions of the etch stop layer adjacent to the residual fill material. The method further comprises anisotropically etching the etch stop layer, the residual fill material and the substrate selectively to the hard mask, thereby forming at least a first and a second isolation trench.

Another embodiment of the present invention provides a method of forming a semiconductor device, comprising etching a deep trench into a substrate through an opening of a first dielectric layer disposed on the substrate, forming a trench capacitor having a lower part and an upper part, the upper part having a top surface being recessed below a main surface of the substrate, wherein forming the lower part comprises forming a first electrode within a lower part of the deep trench, forming a second dielectric layer on a bottom and on sidewalls of the lower part of the deep trench and filling the lower part of the deep trench with a conductive filling.

Forming the upper part of the trench capacitor comprises forming a collar on sidewalls of an upper part of the deep trench and filling the upper part of the deep trench with the conductive filling to form a second electrode of the deep trench capacitor, wherein the second electrode comprises the conductive filling in the lower part of the deep trench and the conductive filling in the upper part of the deep trench.

The method further comprises depositing a fill material on the top surface of the upper part of the trench capacitor and on the first dielectric layer, wherein the fill material fills the opening of the first dielectric layer, removing the fill material disposed above the first dielectric layer, thereby leaving an exposed top surface of the first dielectric layer and residual fill material within the opening, forming a hard mask material on the exposed top surface of the first dielectric layer and on the residual fill material, patterning the hard mask material for forming a hard mask having at least a first and a second trench, the first and second exposing portions of the residual fill material adjacent to the first dielectric layer and portions of the first dielectric layer adjacent to the residual fill material.

The method further comprises anisotropically etching the first dielectric layer, the residual fill material, the substrate, the collar and the conductive filling disposed in the upper part of the deep trench selectively to the hard mask, thereby forming at least a first and a second isolation trench.

Another embodiment of the present invention provides a method of forming a semiconductor device, comprising providing a substrate having a first dielectric layer disposed thereon, wherein the first dielectric layer has an opening and wherein a trench capacitor is disposed in a deep trench of the substrate below the opening. The trench capacitor has a lower part and an upper part, wherein a top surface of the upper part is recessed below a main surface of the substrate, the lower part of the trench capacitor comprising a first electrode, a portion of a second electrode and a second dielectric layer disposed between the first electrode and the portion of the second electrode.

The upper part of the trench capacitor comprises a collar formed on sidewalls of an upper part of the deep trench and another portion of the second electrode filling the upper part of the deep trench.

The method further comprises depositing a fill material on the top surface of the upper part of the trench capacitor and on the first dielectric layer, removing the fill material disposed above the first dielectric layer, thereby leaving an exposed top surface of the first dielectric layer and residual fill material within the opening, forming a hard mask material on the exposed top surface of the first dielectric layer and on the residual fill material, patterning the hard mask material for forming a hard mask having at least a first and a second trench, the first second trenches exposing portions of the residual fill material adjacent to the first dielectric layer and portions of the first dielectric layer adjacent to the residual fill material.

The method further comprises anisotropically etching the first dielectric layer, the residual fill material, the substrate, the collar and the other portion of the second electrode selectively to the hard mask, thereby forming at least a first and a second isolation trench.

BRIEF DESCRIPTION OF THE DRAWINGS

Embodiments of the invention are better understood with reference to the following drawings. The elements of the drawings are not necessarily to scale relative to each other.

DETAILED DESCRIPTION OF ILLUSTRATIVE EMBODIMENTS

Figure 3:
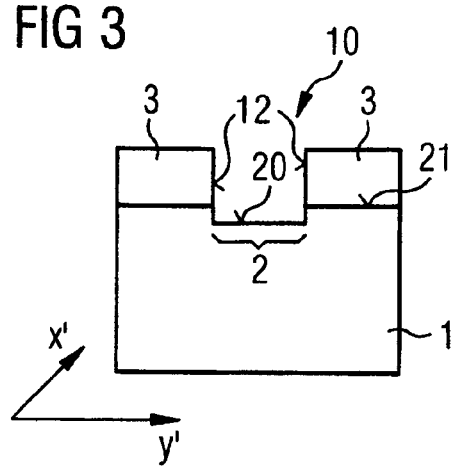
FIGS. 3 to 8 depict a semiconductor device in different stages of a process of forming a trench isolation according to one embodiment of the present invention.

FIG. 3 shows a semiconductor device according to one embodiment of the present invention in a stage of the fabrication process. A dielectric layer 3 having an opening 10 is disposed on a substrate 1, wherein sidewalls 12 of the dielectric layer 3 are exposed. The substrate 1 is preferably a monocrystalline semiconductor wafer such as a silicon wafer. The dielectric layer 3 is preferably a silicon nitride layer that may be used in a following etching process as an etch stop layer. However, the dielectric layer 3 may comprise another material suitable as an etch stop layer. A portion 2 of the substrate 1 is located below the opening 10 of the dielectric layer 3, wherein the substrate portion 2 is not covered by the dielectric layer 3. Accordingly, a top surface 20 of the substrate portion 2 is exposed. Preferably, the top surface 20 of the substrate portion 2 is recessed below a main surface 21 of the substrate 1. According to one embodiment of the present invention, the substrate portion 2 comprises an oxide material such as silicon oxide.

Figure 4:
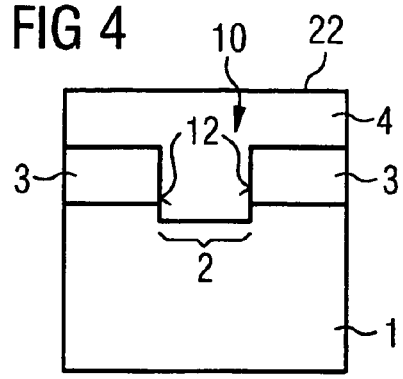

With reference to FIG. 4, a fill material 4 is deposited. The fill material 4 preferably comprises boro-silicate glass or spin-on glass. The fill material 4 may comprise other materials suitable for filling the opening 10 without the formation of voids. As depicted, the fill material 4 is deposited on the substrate portion 2, on the dielectric layer 3 and on the exposed sidewalls 12 of the dielectric layer 3. The fill material 4 fills the opening 10 such that no voids are formed in the fill material 4 or between the opening 10 of the dielectric layer 3 and the fill material. Preferably, the fill material 4 is deposited to form a layer of fill material having a substantially planar top surface 22.

Figure 5:
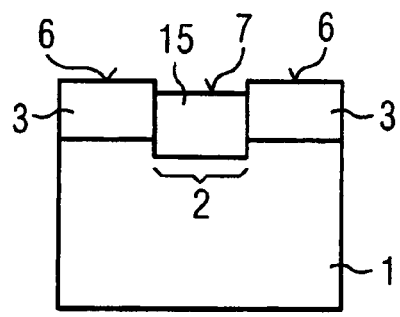

With reference to FIG. 5, the fill material 4 disposed above the dielectric layer 3 is removed, thereby leaving an exposed top surface 6 of the dielectric layer 3 and an exposed top surface 7 of a residual fill material 15 disposed within the opening 10 of the dielectric layer 3. As depicted in FIG. 5, the removal of the fill material 4 also includes the removal of portions of the fill material 4 disposed above the substrate portion 2. Due to the specific process for removing the fill material 4, the exposed top surface 7 of the residual fill material 15 within the opening 10 may be recessed below the exposed top surface 6 of the dielectric layer 3. The removal of the fill material 4 may be accomplished by a chemical-mechanical polishing process or a dry etch process.

The dry etch process may be performed in a dry etching tool having an upper and a lower RF source. The etch process includes operating the lower RF source and the upper RF source at specific power levels and flowing an etching gas that selectively etches the fill material 4 to the dielectric layer 3. For etching a fill material 4 comprising boro-silicate glass selectively to a dielectric layer 3 comprising silicon nitride, the etching gas preferably comprises a polymerizing CF chemistry containing at least one of $CF_4$, $C_4F_6$, $C_5F_8$ or $C_4F_8$ or mixtures of these gases. The etching gas preferably further comprises polymer-removing gases such as CO, $O_2$ or mixtures of these together with a neutral carrier gas like argon, helium, $N_2$ or mixes thereof. According to one embodiment of the present invention, the etch process is performed at pressures of between 20 mTorr and 100 mTorr at a power level of between 0 W and 4000 W of the upper RF source and at a power level of between 1000 W and 3000 W of the lower RF source.

According to one embodiment of the present invention, the removal of the fill material 4 comprises two etching steps. The first etching step is performed using the etch parameters as noted above. A second etching step is performed using substantially the same parameters as for the first etching step, but operating the lower RF source at a lower power level and adjusting the ratio between $C_4F_6$ and $O_2$.

According to one embodiment of the present invention, the fill material 4 is removed by a chemical-mechanical polishing process. The chemical-mechanical polishing process includes contacting the fill material 4 with an abrasive pad, concurrently applying a suitable etchant, e.g., a slurry or a solution that etches the fill material 4, selectively to the dielectric layer 3 and moving the substrate 1 with respect to abrasive pad.

Figure 6:
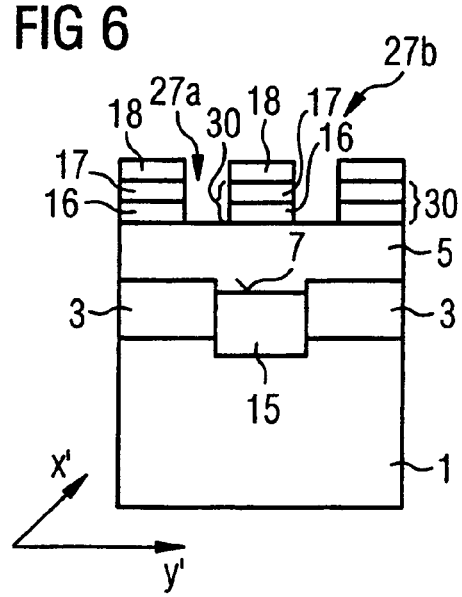

With reference to FIG. 6, a hard mask material 5 is formed on the exposed top surface 6 of the dielectric layer 3 and on the top surface 7 of the residual fill material 15 located in the opening 10 of the dielectric layer 3. The hard mask material 5 is preferably selected to comprise a material that has a high etching selectivity with regard to an oxide so that residual fill material 15 and oxide material disposed in the substrate 1 can be etched selectively to the hard mask material 5. In one embodiment the hard mask material 5 comprises carbon.

Then an anti-reflective coating layer 30 is deposited on the hard mask material 5, the anti-reflective coating layer 30 consisting of a polysilicon layer 16 on the hard mask material 5 and a silicon oxynitride layer 17 on the polysilicon layer 16. Thereafter, a photoresist material 18 is deposited on the anti-reflective coating layer 30.

Thereafter, the photoresist material 18 is patterned by means of photolithography to form a patterned photoresist mask having trenches extending along a first direction X', wherein the trenches are located above outer portions of the residual fill material 15 adjacent to the dielectric layer 3 and above portions of the dielectric layer 3 adjacent to the residual fill material 15. Then the silicon oxynitride layer 17 and the polysilicon layer 16 are etched selectively with regard to the patterned photoresist mask 18 thereby leaving residual portions of the silicon oxynitride layer 17 and of the polysilicon layer 16 extending along the first direction X' and thereby forming trenches 27a, 27b that expose portions of the hard mask material 5 extending along the first direction X'.

Preferably the etching of the silicon oxynitride layer 17 and of the polysilicon layer 16 is performed using a reactive ion etching process in a dry etching tool. Preferably the etching gas comprises $CF_4$ with addition of $CHF_3$, $C_4F_6$ or $O_2$. Typically, the etching is carried out at pressures higher than 100 mTorr. A preferred level of the lower RF source is 500 W and a preferred power level of the upper RF source is 600 W.

Figure 7:
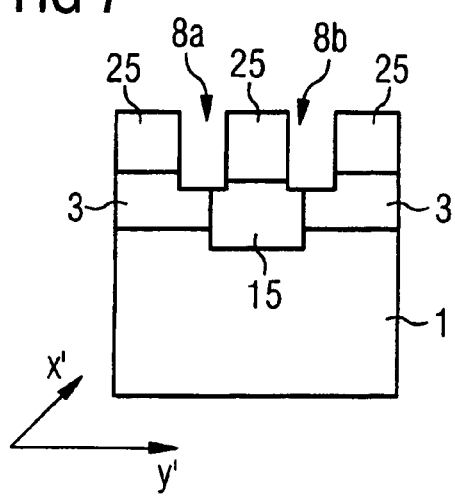

The remaining photoresist material 18 and the remaining silicon oxynitride material 17 may be removed during the reactive ion etching process or after the reactive ion etching process has been stopped. Thereafter, the hard mask material 5 is etched selectively to the residual portions of the polysilicon layer 16 to form a hard mask 25 having a first trench 8A and a second trench 8B extending along the first lateral direction X'. Thereby portions of the dielectric layer 3 adjacent to the residual fill material 15 and portions of the residual fill material 15 adjacent to the dielectric layer 3 are exposed as depicted in FIG. 7.

The etching of the hard mask material 5 is performed using a reactive ion etch process in a dry etch tool. Preferably, the etching gas comprises CO and O. Typically, the etching is carried out at pressures of about 10 mTorr or at higher pressures. A preferred power level of the lower RF source is 300 W and a preferred power level of the upper RF source is 1000 W.

Figure 8:
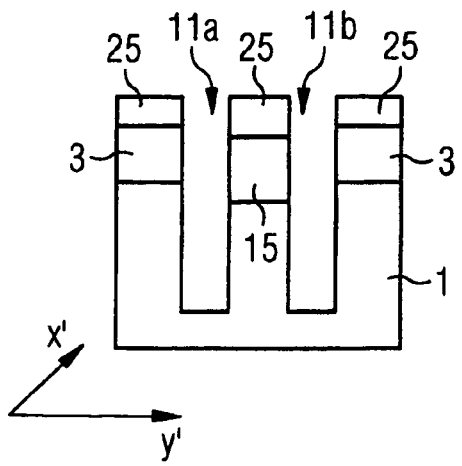

With reference to FIG. 8, the residual fill material 15, the dielectric layer 3 and the substrate portion 2 are then etched selectively to the hard mask 25 to form a first isolation trench 11a and a second isolation trench 11b extending along the first lateral direction X'.

The etching of the residual fill material 15, of the dielectric layer 3 and of the substrate 1 is performed using a reactive ion etch process in a dry etch tool. Preferably, the etching gas comprises $CF_4$, $C_4F_6$, $CH_3$, CO, $O_2$ or mixtures thereof. Typically, the etching is carried out at pressures of between 15 mTorr and 30 mTorr. A preferred level of the lower RF source is 1000 W and a preferred power level of the upper RF source is 1000 W.

In a subsequent process step, the first and the second isolation trenches 11a, 11b may be filled with an insulting material.

Figure 9:
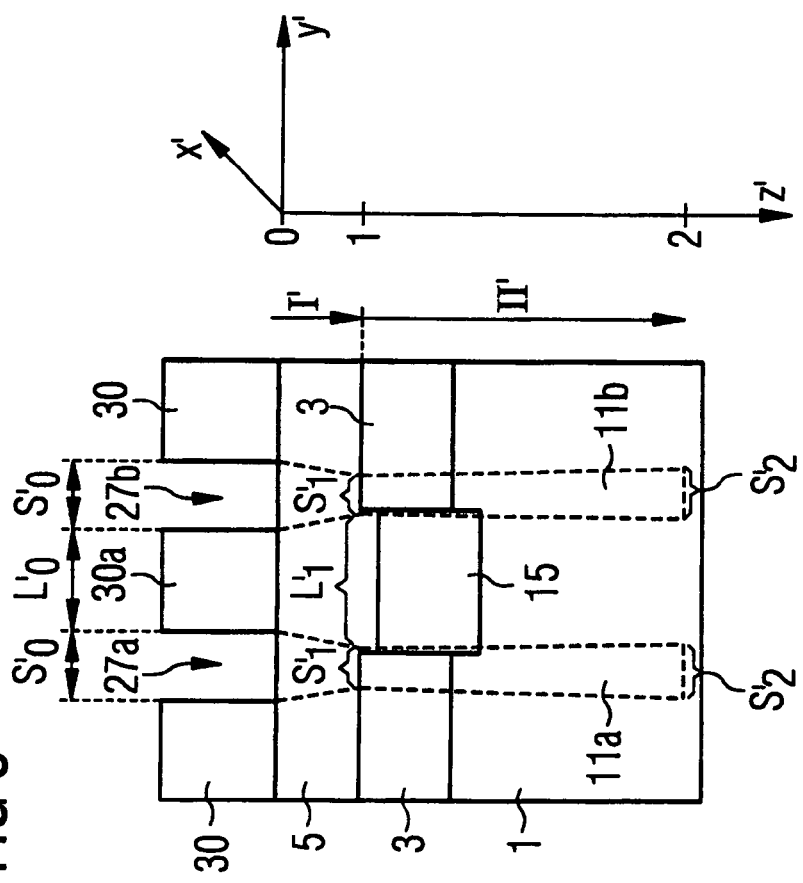
FIG. 9 depicts the semiconductor device as depicted in FIG. 6 and illustrates the etching steps performed to form the isolation trenches.

FIG. 9 depicts the semiconductor device as depicted in FIG. 6 with the remaining photoresist material being removed, before the step of etching the hard mask material 5. With reference to FIG. 9, the etching of the hard mask material 5 is indicated as first etching process I' and the etching of the residual fill material 15, of the dielectric layer 3 and of the substrate 1 is indicated as second etching process II'. The resulting isolation trenches 11a, 11b are indicated by dashed lines. The first and the second trenches 27a, 27b disposed between the residual portions of anti-reflective coating layer 30 each have a lateral dimension $S_0'$ along the direction Y' as depicted in FIG. 9. A remaining portion 30a of the patterned anti-reflective coating layer 30 located between the first and second trenches 27a, 27b has a lateral dimension $L_0'$ along the direction Y'.

Figure 10A:
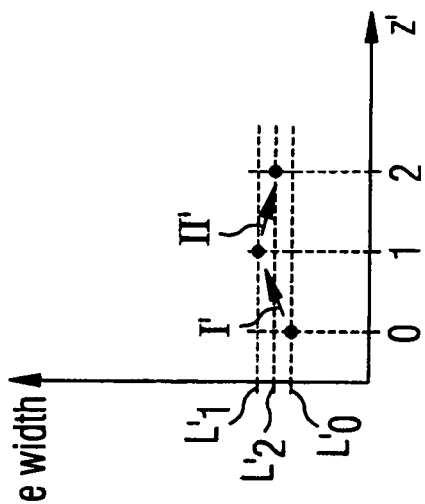
FIG. 10A illustrates line widths located at different Z'-positions as indicated in FIG. 9.
Figure 10B:
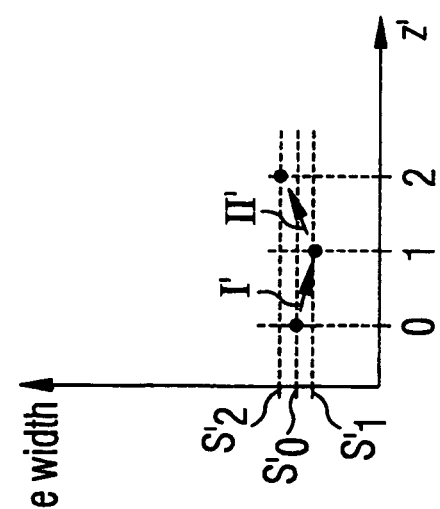
FIG. 10B illustrates space widths located at different Z'-positions as indicated in FIG. 9.

With reference to FIGS. 10A and 10B, the lateral dimensions space width (S') and line width (L') are depicted dependent on the position along the direction Z' as shown in FIG. 9. The Z'-position "1" relates to the interface between the hard mask material 5 and the dielectric layer 3 and the Z'-position "2" relates to a bottom of the isolation trenches 11a, 11b formed in the substrate 1.

Figure 2A:
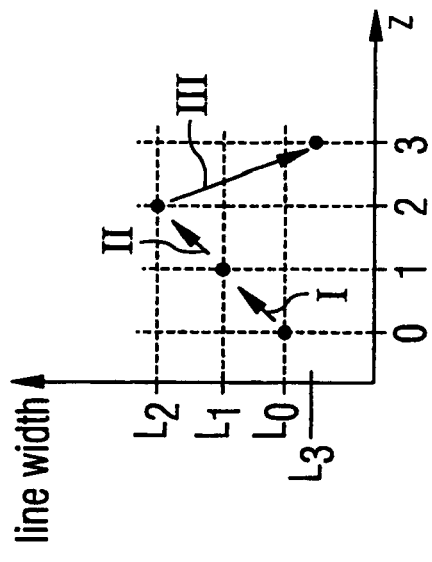
FIG. 2A illustrates line widths located at different Z-positions as indicated in FIG. 1.
Figure 2B:
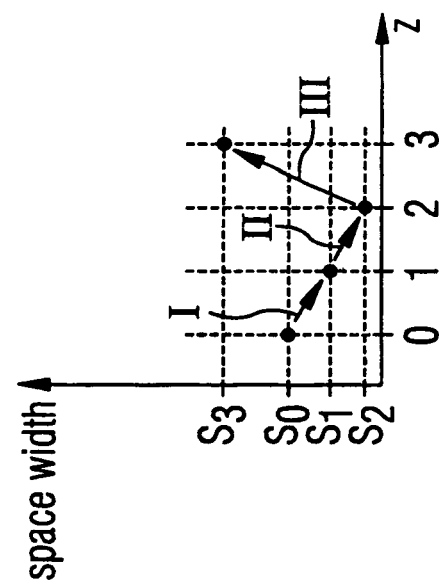
FIG. 2B illustrates space widths located at different Z-positions as indicated in FIG. 1.
Figure 1:
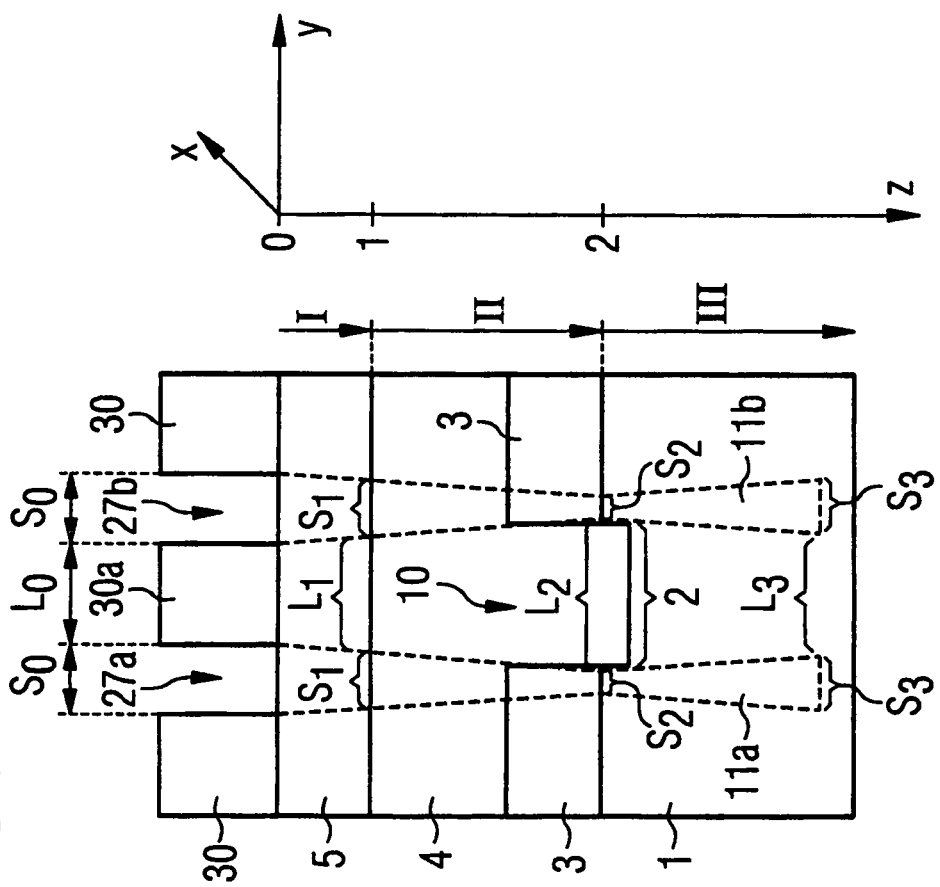
FIG. 1 illustrates a process for forming a trench isolation on a structured wafer.

As depicted in FIG. 10B, the space width increases during the second etch step II', in which the isolation trenches 11a, 11b are etched, only slightly compared to the increase of the space width in the third etch step III depicted in FIGS. 1, 2a and 2b. Accordingly, the process of forming isolation trenches 11a, 11b according to the present invention can be used for higher integration schemes than the process illustrates with reference to FIGS. 1, 2A and 2B.

The reason for the improved performance of the process according to the present invention is that the etching gas has to travel only through the hard mask 25 to reach the substrate 1, whereas according to the process illustrated with reference to FIGS. 1, 2A and 2B, the etching gas has to travel a longer path through the patterned hard mask and the fill material 4 to reach the substrate 1. Furthermore, if the substrate portion 2 comprises an oxide, the substrate portion 2 can be etched with suitable etching gases selectively to a hard mask comprising carbon. In contrast, the etching of a substrate portion 2 comprising an oxide in the process according to FIGS. 1, 2A and 2B is difficult, because the fill material typically also comprises an oxide.

FIGS. 11 to 17 illustrate a semiconductor device in different stages of the fabrication process according to one embodiment of the invention.

Figure 11:
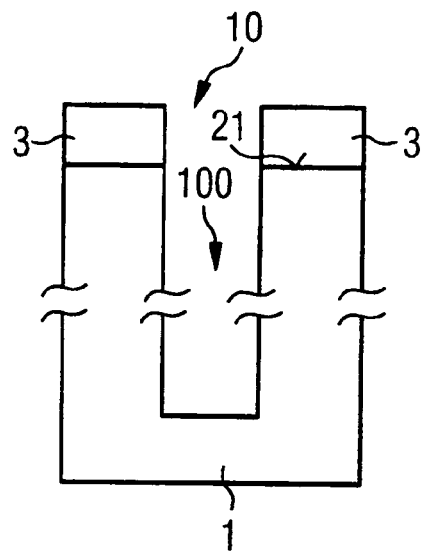
FIGS. 11 to 17 depict a semiconductor device in different stages of the fabrication process according to one embodiment of the present invention.

FIG. 11 depicts a substrate 1 having a dielectric layer 3 disposed thereon. The dielectric layer 3 has an opening 10 through which a deep trench 100 has been formed in the substrate 1.

Figure 12:
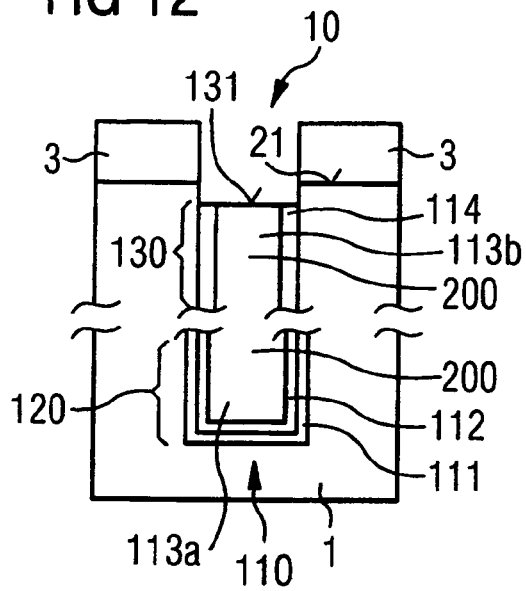

With reference to FIG. 12, a trench capacitor 110 is formed in the deep trench 100. The trench capacitor 110 has a lower part 120 and an upper part 130. The lower part 120 comprises a first electrode 111 preferably disposed within the substrate 1 adjacent to a lower part of the deep trench 100, a dielectric layer 112 disposed on the bottom and on sidewalls of the lower part of the deep trench 100 and a conductive filling 200 that fills at least the lower part of the deep trench 100. The conductive filling 200 disposed in the lower part of the deep trench 100 forms a portion 113a of a second electrode 113 of the trench capacitor 110. The upper part 130 of the trench capacitor 110 has a collar 114 disposed on sidewalls of an upper part of the deep trench 100 and the conductive filling 200 also fills the upper part of the deep trench 100. The conductive filling 200 disposed in the upper part of the deep trench 100 forms another portion 113b of the second electrode 113 of the trench capacitor 110. The collar 114 isolates the conductive filling 200 disposed in the upper part of the deep trench 100 from the substrate 1. The conductive filling 200 disposed in the lower part of the deep trench 100 and the conductive filling 200 disposed in the upper part of the deep trench 100 form a second electrode 113 of the trench capacitor 110.

As depicted in FIG. 12, a top surface 131 of the upper part 130 of the trench capacitor 110 is recessed below a main surface 21 of the substrate 1, wherein the top surface 131 of the upper part 130 of the trench capacitor 110 comprises a top surface of the collar 114 and a top surface of the conductive filling 200 disposed in the upper part of the deep trench 100. The opening 10 of the dielectric layer 3 is disposed above the upper part 130 of the trench capacitor 110 and the top surfaces of the collar 114 and of the conductive filling 200 disposed in the upper part of the deep trench 100 are exposed.

Forming the trench capacitor 110 may comprise forming the collar 114 on sidewalls of the upper part of the trench, forming the first electrode 111 in the substrate 1 adjacent to the lower part of the deep trench 100, forming the dielectric layer 112 on sidewalls of the lower part of the deep trench 100 and on the bottom of the deep trench 100 and filling the lower part and the upper part of the deep trench 100 with a conductive filling 200 such as doped polysilicon.

Forming the collar 114 may comprise forming a dielectric material such as silicon oxide on sidewalls of the upper part of the deep trench 100.

Forming the first electrode 111 may include depositing a conductive material comprising dopants such as doped polysilicon on the bottom and sidewalls in the lower part of the deep trench 100 and performing a heat treatment, thereby inducing diffusion of the dopants into the substrate 1. Forming the dielectric layer 112 may include the deposition of a dielectric material on the bottom and on sidewalls of the lower part of the deep trench 100.

Figure 13:
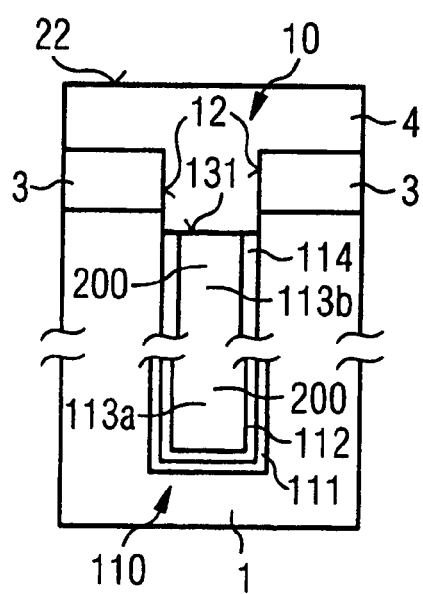

With reference to FIG. 13, a fill material 4 is deposited. The fill material 4 preferably comprises boro-silicate glass or spin-on glass. The fill material 4 may comprise other materials suitable for filling the opening 10 without the formation of voids. As depicted, the fill material 4 is deposited on the top surface 131 of the upper part 130 of the trench capacitor 110, on the dielectric layer 3 and on exposed sidewalls 12 of the dielectric layer 3. The fill material 4 fills the opening 10 such that no voids are formed in the fill material 4 or between the opening 10 of the dielectric layer 3 and the fill material. Preferably, the fill material 4 is deposited to form a layer of fill material having a substantially planar top surface 22.

Figure 14:
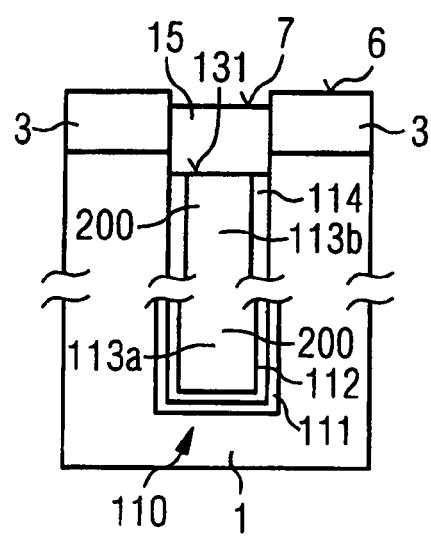

With reference to FIG. 14, the fill material 4 disposed above the dielectric layer 3 is removed, thereby leaving an exposed top surface 6 of the dielectric layer 3 and an exposed top surface 7 of a residual fill material 15 disposed within the opening 10 of the dielectric layer 3. As depicted in FIG. 14, the removal of the fill material 4 also includes the removal of portions of the fill material 4 disposed above the top surface 131 of the upper part 130 of the trench capacitor 110. Due to the specific process for removing the fill material 4, the exposed top surface 7 of the residual fill material 15 within the opening 10 may be recessed below the exposed top surface 6 of the dielectric layer 3. The removal of the fill material 4 may be accomplished by a chemical-mechanical polishing process or a dry etch process.

The dry etch process may be performed in a dry etching tool having an upper and a lower RF source. The etch process includes operating the lower RF source and the upper RF source at specific power levels and flowing an etching gas that etches selectively the fill material 4 to the dielectric layer 3. For etching a fill material 4 comprising boro-silicate glass selectively to a dielectric layer 3 comprising silicon nitride, the etching gas preferably comprises a polymerising CF chemistry containing at least one of $CF_4$, $C_4F_6$, $C_5F_8$ and $C_4F_8$ or mixes of these gases. The etching gas preferably further comprises polymer-removing gases such as CO, $O_2$ or mixtures of these together with a neutral carrier gas like argon, helium, $N_2$ or mixes thereof. According to one embodiment of the present invention, the etch process is performed at pressures of between 20 mTorr and 100 mTorr at a power level of between 0 W and 4000 W of the upper RF source and at a power level of between 1000 W and 3000 W of the lower RF source.

According to one embodiment of the present invention, the removal of the fill material 4 comprises two etching steps. The first etching step is performed using the etch parameters as noted above. A second etching step is performed using substantially the same parameters as for the first etching step, but operating the lower RF source at a lower power level and adjusting the ratio between $C_4F_6$ and $O_2$.

According to one embodiment of the present invention, the fill material 4 is removed by a chemical-mechanical polishing process. The chemical-mechanical polishing process includes contacting the fill material 4 with an abrasive pad, concurrently applying a suitable etchant, e.g., a slurry or a solution that etches the fill material 4, selectively to the dielectric layer 3 and moving the substrate 1 with respect to the abrasive pad.

Figure 15:
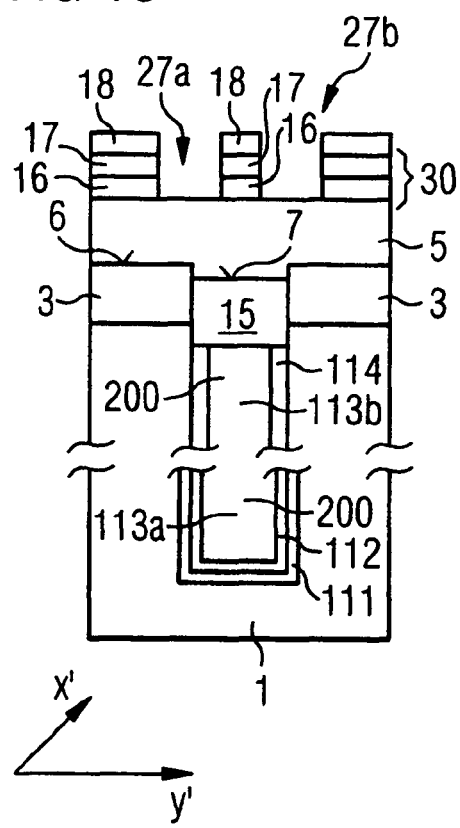

With reference to FIG. 15, a hard mask material 5 is formed on the exposed top surface 6 of the dielectric layer 3 and on the top surface 7 of the residual fill material 15 located in the opening 10 of the dielectric layer 3. The hard mask material 5 is preferably selected to comprise a material that has a high etching selectivity with regard to an oxide so that residual fill material 15 and a collar 114 comprising an oxide can be etched selectively to the hard mask material 5. In one embodiment the hard mask material 15 comprises carbon, however, the hard mask material 5 may comprise other materials providing a high etching selectivity to an oxide.

Then an anti-reflective coating layer 30 is deposited on the hard mask material 5, the anti-reflective coating layer 30 consisting of a polysilicon layer 16 on the hard mask material 5 and a silicon oxynitride layer 17 on the polysilicon layer 16. Thereafter, a photoresist material 18 is deposited on the anti-reflective coating layer 30.

Thereafter, the photoresist material 18 is patterned by means of photolithography to form a patterned photoresist mask having trenches extending along a first direction X' and being disposed above a portion of the residual fill material 15 adjacent to the dielectric layer 3 and above portions of the dielectric layer 3 adjacent to the residual fill material 15. Then the silicon oxynitride layer 17 and the polysilicon layer 16 are etched selectively with regard to the patterned photoresist mask 18, thereby leaving residual portions of the silicon oxynitride layer 17 and the polysilicon layer 16 extending along the first direction X' and thereby exposing portions of the hard mask material 5 extending along the first direction X'.

Preferably the etching of the silicon oxynitride layer 17 and of the polysilicon layer 16 is performed using a reactive ion etching process in a dry etching tool. Preferably, the etching gas comprises $CF_4$ with addition of $CHF_3$, $C_4F_6$ or $O_2$. Typically, the etching is carried out at pressures higher than 100 mTorr. A preferred level of the lower RF source is 500 W and a preferred power level of the upper RF source is 600 W.

Figure 16:
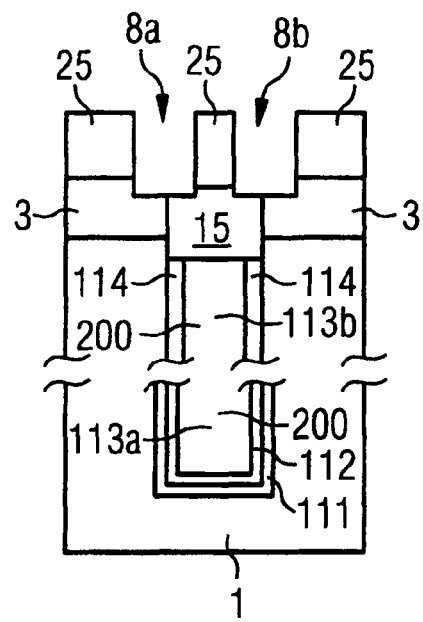

The remaining photoresist material 18 and the remaining silicon oxynitride material 17 may be removed during the reactive ion etching process or after the reactive ion etching process has been stopped. Thereafter, the hard mask material 5 is etched selectively with regard to the residual portions of the polysilicon layer 16 for forming a hard mask 25 having a first trench 8A and a second trench 8B extending along the first lateral direction X'. Thereby portions of the dielectric layer 3 adjacent to the residual fill material 15 and portions of the residual fill material 15 adjacent to the dielectric layer 3 are exposed, as depicted in FIG. 16.

The etching of the hard mask material 5 is performed using a reactive ion etch process in a dry etch tool. Preferably, the etching gas comprises carbon monoxide and oxygen. Typically, the etching is carried out at pressures of about 10 mTorr or higher. A preferred level of the lower RF source is 300 W and a preferred power level of the upper RF source is 1000 W.

Figure 17:
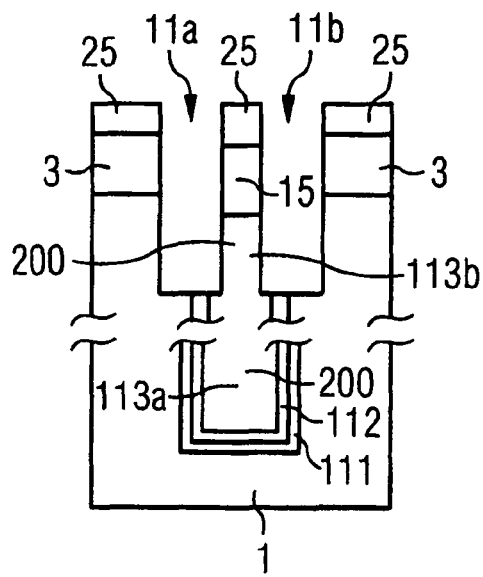

With reference to FIG. 17, the residual fill material 15, the dielectric layer 3, the collar 114, the substrate 1 and the conductive filling 200 disposed in the upper part of the deep trench 100 are then etched selectively to the hard mask 25 to form a first isolation trench 11a and a second isolation trench 11b extending along the direction X'.

The etching of the residual fill material 15, of the dielectric layer 3, of the collar 114, of the substrate 1 and of the conductive filling 200 disposed in the upper part of the deep trench 100 is performed using a reactive ion etching process in a dry etch tool. Preferably, the etching gas comprises $CF_4$, $C_4F_6$, $CH_3$, $CO$, $O_2$ or mixtures thereof. Typically, the etching is carried out at pressures of between 15 mTorr and 30 mTorr. A preferred level of the lower RF source is 1000 W and a preferred power level of the upper RF source is 1000 W.

In a subsequent process step, the first and the second isolation trenches 11a, 11b may be filled with an insulating material.

What is claimed is:

1. A method of forming an integrated circuit, the method comprising:
   depositing a fill material on at least a portion of a substrate and on a dielectric layer disposed on said substrate, said dielectric layer having an opening located above said substrate portion, said fill material filling said opening;
   removing the fill material disposed above said dielectric layer, thereby leaving an exposed top surface of said dielectric layer and residual fill material within said opening;
   forming a hard mask material on said exposed top surface of said dielectric layer and on said residual fill material;
   patterning said hard mask material for forming a hard mask exposing at least two portions of said residual fill material adjacent to said dielectric layer and portions of said dielectric layer adjacent to said residual fill material; and
   anisotropically etching exposed portions of said dielectric layer and said residual fill material and said substrate selectively to said hard mask to form a trench extending from a top surface of said residual fill material to an exposed surface of the substrate, wherein said trench has a first width adjacent said top surface of said residual fill material, and a second width adjacent said exposed surface of the substrate, wherein said first width is smaller than said second width.

2. The method according to claim 1, wherein a top surface of said substrate portion is recessed below a main surface of said substrate.

3. The method according to claim 1, wherein removing the fill material comprises etching said fill material with an etching gas selectively to said dielectric layer.

4. The method according to claim 3, wherein said etching gas comprises at least one gas selected from the group consisting of $CF_4$, $C_4F_6$, $C_5F_8$ and $C_4F_8$.

5. The method according to claim 3, wherein said etching gas comprises at least one gas selected from the group consisting of CO and $O_2$.

6. The method according to claim 1, wherein said dielectric layer comprises silicon nitride.

7. The method according to claim 1, wherein said fill material comprises boro-silicate glass or spin-on glass.

8. The method according to claim 1, wherein removing the fill material comprises performing a chemical-mechanical polishing process including contacting the fill material with an abrasive pad, concurrently applying a slurry or a solution comprising etchants.

9. The method according to claim 1, wherein a top surface of said residual fill material is recessed below said exposed top surface of said dielectric layer.

10. The method according to claim 1, wherein forming said hard mask material comprises forming a hard mask material comprising carbon.

11. The method according to claim 1, wherein patterning said hard mask material comprises forming a patterned anti-reflective coating layer on said hard mask material above said substrate portion and above said dielectric layer.

12. The method according to claim 11, wherein forming said patterned anti-reflective coating layer comprises forming a polysilicon layer on said hard mask material, forming a silicon oxynitride layer on said polysilicon layer, forming a photoresist layer on said silicon oxynitride layer, patterning said photoresist layer and etching said polysilicon layer and said silicon oxynitride layer selectively to said patterned photoresist layer.

13. The method according to claim 1, wherein said substrate is a silicon wafer.

14. A method of forming an integrated circuit, the method comprising:
    depositing a fill material on at least a portion of a substrate and on an etch stop layer disposed on said substrate, said etch stop layer having an opening located above said substrate portion, said fill material filling said opening;
    removing the fill material disposed above said etch stop layer, thereby leaving an exposed top surface of said etch stop layer and residual fill material within said opening;
    forming a hard mask on said exposed top surface of said etch stop layer and on said residual fill material, said hard mask exposing at least two portions of said residual fill material adjacent to said etch stop layer and portions of said etch stop layer adjacent to said residual fill material; and
    anisotropically etching the exposed portions of said etch stop layer and said residual fill material and said substrate selectively to said hard mask to form a trench extending from a top surface of said residual fill material to an exposed surface of the substrate, wherein said trench has a first width adjacent said top surface of said residual fill material, and a second width adjacent said exposed surface of said substrate, wherein said first width is smaller than said second width.

15. The method according to claim 14, wherein a top surface of said substrate portion is recessed below a main surface of said substrate.

16. The method according to claim 14, wherein removing the fill material comprises etching said fill material with an etching gas selectively to said etch stop layer.

17. The method according to claim 16, wherein said etching gas comprises at least one gas selected from the group consisting of $CF_4$, $C_4F_6$, $C_5F_8$ and $C_4F_8$.

18. The method according to claim 16, wherein said etching gas comprises at least one gas selected from the group consisting of CO and $O_2$.

19. The method according to claim 14, wherein said etch stop layer comprises silicon nitride.

20. The method according to claim 14, wherein said fill material comprises boro-silicate glass or spin-on glass.

21. The method according to claim 14, wherein removing the fill material comprises performing a chemical-mechanical polishing process including contacting the fill material with an abrasive pad, concurrently applying a slurry or a solution comprising etchants.

22. The method according to claim 14, wherein a top surface of said residual fill material is recessed below said top surface of said dielectric layer.

23. The method according to claim 14, wherein said substrate is a silicon wafer.

24. A method of forming an integrated circuit, the method comprising:
    depositing a silicon nitride layer over a semiconductor substrate, the silicon nitride layer contacting a top surface of the semiconductor substrate;
    forming a first opening in the silicon nitride layer to expose a new top surface of the substrate, the new top surface being below the top surface;
    depositing a fill material on the silicon nitride layer, the fill material filling the first opening;
    polishing the fill material to expose a top surface of the silicon nitride layer thereby leaving a portion of the first opening filled with the fill material, a top surface of the fill material disposed below the top surface of the silicon nitride layer;
    depositing a hard mask on the top surface of the silicon nitride layer and the top surface of the fill material;
    depositing an anti-reflective coating layer on the hard mask layer;
    depositing a photoresist layer on the anti-reflective coating layer;
    patterning the photoresist layer to form a second opening;
    in a dry etch tool, patterning the hard mask to form a third opening and a fourth opening using a first reactive ion etch process, the third opening exposing a first portion of the fill material and a first top surface of the silicon nitride layer adjacent the first portion, the fourth opening exposing a second portion of the fill material and a second top surface of the silicon nitride layer adjacent the second portion;
    in a dry etch tool, using a second reactive ion etch process, forming a first trench and a second trench by anisotropically etching through the first and the second top surfaces of the silicon nitride layer, the first and the second portions of the fill material, and a portion of the substrate; and
    filling the first and the second trenches with an insulating fill material.

25. The method according to claim 24, wherein depositing an anti-reflective coating layer comprises:
    depositing a polysilicon layer on the hard mask layer; and
    depositing a silicon oxynitride layer on the polysilicon layer.

26. The method according to claim 24, wherein the first reactive ion etch process comprises etching with at least one gas selected from the group consisting of CO and O.

27. The method according to claim 26, wherein the first reactive ion etch is carried out at a pressure of at least 10 mTorr, wherein a lower RF source power is about 300 W and wherein an upper RF source power is about 1000 W.

28. The method according to claim 24, wherein the second reactive ion etch process comprises etching with at least one gas selected from the group consisting of $CF_4$, $C_4F_6$, $CH_3$, CO and $O_2$.

29. The method according to claim 28, wherein the second reactive ion etch is carried out at a pressure between about 15 mTorr to about 30 mTorr.

30. The method according to claim 28, wherein a lower RF source power is about 1000 W and wherein an upper RF source power is about 1000 W.

31. The method according to claim 24, wherein the first trench extends from the top surface of the fill material to an exposed surface of the substrate, wherein the first trench has a first width adjacent the top surface of the fill material, and a second width adjacent the exposed surface of the substrate, and wherein the first width is smaller than the second width.

* * * * *